US009405020B2

(12) United States Patent
Yamashita et al.

(10) Patent No.: US 9,405,020 B2
(45) Date of Patent: *Aug. 2, 2016

(54) SCINTILLATOR PANEL MANUFACTURING METHOD, SCINTILLATOR PANEL, AND RADIATION DETECTOR

(71) Applicant: HAMAMATSU PHOTONICS K.K., Hamamatsu-shi, Shizuoka (JP)

(72) Inventors: Masanori Yamashita, Hamamatsu (JP); Yutaka Kusuyama, Hamamatsu (JP); Shintaro Toyama, Hamamatsu (JP); Hirotake Osawa, Hamamatsu (JP); Katsuhiko Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/759,739

(22) PCT Filed: Nov. 5, 2013

(86) PCT No.: PCT/JP2013/079914
§ 371 (c)(1),
(2) Date: Jul. 8, 2015

(87) PCT Pub. No.: WO2014/109116
PCT Pub. Date: Jul. 17, 2014

(65) Prior Publication Data
US 2015/0355342 A1 Dec. 10, 2015

(30) Foreign Application Priority Data
Jan. 9, 2013 (JP) .................................. 2013-001908

(51) Int. Cl.
G01T 1/20 (2006.01)
G01T 1/202 (2006.01)
(Continued)

(52) U.S. Cl.
CPC . *G01T 1/202* (2013.01); *G21K 4/00* (2013.01); *H01L 27/14663* (2013.01); *H01L 27/14683* (2013.01); *H01L 27/14685* (2013.01)

(58) Field of Classification Search
CPC ... G01T 1/1642; G01T 1/1644; G01T 1/2018; G01T 1/20; G01T 1/204
See application file for complete search history.

(56) References Cited

U.S. PATENT DOCUMENTS 5,229,613 A * 7/1993 Pandelisev .............. G01T 1/202
250/363.02
6,921,909 B2 7/2005 Nagarkar et al.
(Continued)

FOREIGN PATENT DOCUMENTS

CN 101013711 8/2007
CN 102610292 7/2012
(Continued)

OTHER PUBLICATIONS

English-language translation of International Preliminary Report on Patentability (IPRP) dated Jul. 23, 2015 that issued in WO Patent Application No. PCT/JP2013/079914.

*Primary Examiner* — David Porta
*Assistant Examiner* — Mamadou Faye
(74) *Attorney, Agent, or Firm* — Drinker Biddle & Reath LLP

(57) ABSTRACT

Provided is a method of manufacturing a scintillator panel configured to convert radiation into scintillation light, the method including a first process of forming a plurality of convex sections that protrude from a rear surface toward a front surface of the substrate in a predetermined direction and concave section defined by the convex sections on the front surface of the substrate having the front surface and the rear surface, a second process of forming first scintillator units respectively extending from the convex sections of the substrate in the predetermined direction through crystal growth of a columnar crystal of a scintillator material, and a third process of radiating a laser beam to contact portions of the first scintillator units extending from the adjacent convex sections and separating the first scintillator units extending from the adjacent convex sections by scanning the concave section with the laser beam.

16 Claims, 8 Drawing Sheets

(51) Int. Cl.
*H01L 27/146* (2006.01)
*G21K 4/00* (2006.01)

(56) References Cited

U.S. PATENT DOCUMENTS

| | | | |
|---|---|---|---|
| 2004/0042585 A1 | 3/2004 | Nagarkar et al. | |
| 2004/0247078 A1* | 12/2004 | Yamagishi | C09K 11/616 250/367 |
| 2013/0048864 A1* | 2/2013 | Nakatsugawa | H01L 27/14618 250/366 |
| 2015/0247935 A1* | 9/2015 | Toyama | G01T 1/202 250/366 |
| 2015/0283648 A1* | 10/2015 | Hisada | B23K 26/0066 403/272 |

FOREIGN PATENT DOCUMENTS

| | | |
|---|---|---|
| CN | 102621574 | 8/2012 |
| JP | 2547908 B2 | 10/1996 |
| JP | 2001-059899 A | 3/2001 |
| JP | 2003-167060 A | 6/2003 |

* cited by examiner

SCINTILLATOR PANEL MANUFACTURING METHOD, SCINTILLATOR PANEL, AND RADIATION DETECTOR

TECHNICAL FIELD

An aspect of the present invention relates to a method of manufacturing a scintillator panel, a scintillator panel, and a radiation detector.

BACKGROUND ART

In the related art, an apparatus including independent scintillators for each pixel of a two-dimensional optical sensor is known. For example, in Patent Literature 1, there is disclosed a radiation detection apparatus including an optical detection panel having a plurality of pixels formed on a substrate, wherein a plurality of convex patterns are formed on at least one pixel of the plurality of pixels on the optical detection panel, and columnar crystals of the scintillator are grown on upper surfaces of the plurality of convex patterns.

In addition, in Patent Literature 2, there is disclosed an X-ray plane detector including a plurality of pixel units arranged in a two-dimensional array, wherein each of the pixel units has a scintillator unit configured to convert X-rays entering from a predetermined input surface into light, and interruption regions formed between the scintillator units of the adjacent pixel units such that the scintillator units are not continuous. The interruption regions are formed by forming grooves throughout the entire width of a scintillator layer through radiation of the laser beam to the scintillator layer. In Patent Literature 3, there is disclosed an X-ray imaging apparatus including a scintillator layer divided into optically independent pixels by grooves formed by laser ablation.

CITATION LIST

Patent Literature

[Patent Literature 1] Japanese Patent No. 2547908
[Patent Literature 2] Japanese Patent Unexamined Application, First Publication No. 2003-167060
[Patent Literature 3] U.S. Pat. No. 6,921,909

SUMMARY OF INVENTION

Technical Problem

In the apparatuses disclosed in Patent Literatures 1 and 2, a decrease in MTF due to crosstalk in the scintillator unit or the like is suppressed by forming the independent scintillator for each of the pixels of the two-dimensional optical sensor in comparison with a case in which the scintillators are formed on the entire surface of the two-dimensional optical sensor.

Here, in order to improve sensitivity characteristics of the scintillator panel, an increase in film thickness of the scintillator may be required. However, since a columnar crystal of the scintillator has a property in which a columnar diameter increases according to a distance from an origin of crystal growth, like the radiation detection apparatus disclosed in Patent Literature 1, in the case in which the crystal of the scintillator is grown on the upper surface of the convex pattern, when a film thickness of the scintillator is increased, the adjacent scintillators may come in contact with each other. While increasing a formation pitch of the convex patterns may be considered to secure independence of the scintillators, in this case, an aperture ratio may decrease. Meanwhile, in the X-ray plane detector disclosed in Patent Literature 2, since the grooves are formed throughout the entire thickness of the scintillator layer, deterioration of the columnar crystal of the scintillator caused by radiation of the laser beam occurs throughout the entire thickness of the scintillator layer, and a decrease in brightness may increase. Further, as disclosed in Patent Literature 3, when the scintillator layer having a large thickness is processed by laser ablation, a laser beam incident portion of the scintillator layer is processed through a wider range than the laser beam processing tip portion, and thus the grooves formed by the laser beam are formed in wedge shapes. For this reason, since the processing range of the laser beam incident portion increases as the thickness of the scintillator layer increases, more than a necessary groove width of the scintillator layer may be lost, which may cause a decrease in X-ray absorption performance.

In consideration of the above-mentioned circumstances, an aspect of the present invention is directed to provide a method of manufacturing a scintillator panel, a scintillator panel, and a radiation detector that are capable of increasing a film thickness while suppressing deterioration of a crystal.

Solution to Problem

In order to solve these problems, according to an aspect of the present invention, there is provided a method of manufacturing a scintillator panel configured to convert radiation into scintillation light, the method including: a first process of forming a plurality of convex sections that protrude in a predetermined direction from a rear surface toward a front surface and concave section defined by the convex sections, on the front surface of the substrate having the front surface and the rear surface; a second process of forming first scintillator units respectively extending from the convex sections of the substrate in the predetermined direction through crystal growth of a columnar crystal of a scintillator material; and a third process of radiating a laser beam to contact portions of the first scintillator units extending from the adjacent convex sections and separating the first scintillator units extending from the adjacent convex sections by scanning the laser beam along the concave section.

In the method of manufacturing the scintillator panel, as the columnar crystals of the scintillator material are grown, the first scintillator units respectively extending from the convex sections of the substrate in the predetermined direction are formed. For this reason, for example, the first scintillator units are formed to be separated from each other by a predetermined height with upper surfaces of the convex sections as an origin, and formed on the concave section at the predetermined height or more to come in contact with each other. Accordingly, as the concave section is scanned with the laser beam, when the laser beam is radiated to the contact portions between the first scintillator units to separate the first scintillators from each other, the first scintillator units having an increased thickness are obtained. In addition, since the laser beam may be preferably radiated to only the contact portion upon separation of the first scintillator units, deterioration of the crystals can be suppressed. Further, a groove width formed by laser processing can be suppressed from increasing beyond a groove width needed for suppression of crosstalk.

The method of manufacturing the scintillator panel according to the aspect may further include a fourth process of forming second scintillator unit on bottom surfaces of the concave section of the substrate, before the third process. In this case, since the second scintillator unit formed on the bottom surfaces of the concave section function as a protective film, damage to interconnections or the like installed on the substrate when the laser beam is radiated can be prevented.

In the method of manufacturing the scintillator panel according to the aspect, in the first process, in the first process, the concave section defined in a lattice shape are formed on the front surface of the substrate by forming the convex sections to be arranged on the front surface of the substrate in a two-dimensional array, and in the fourth process, a thickness of the second scintillator unit in a crossing region of the concave section may be larger than a thickness of the second scintillator unit at a position other than the crossing region. In this case, when a lattice-shaped concave section is scanned with the laser beam, since the second scintillator unit having a relatively larger thickness function as the protective film in the crossing region of the concave section to which the laser beam is radiated twice, damage to interconnections or the like installed on the substrate can be securely prevented.

According to another aspect of the present invention, there is provided a scintillator panel configured to convert radiation into scintillation light, the scintillator panel including: a substrate having a front surface and rear surface, the substrate is formed with a plurality of convex sections protruding from the front surface in a predetermined direction from the rear surface toward the front surface, and concave section defined by the convex sections; and a plurality of first scintillator units respectively extending from the convex sections in the predetermined direction and separated from each other, wherein the first scintillator units are respectively formed through growth of a plurality of columnar crystals on the convex sections, and at least a part of the columnar crystals constituting the first scintillator unit over bottom surface of the concave section are fused and adhered to each other through radiation of a laser beam.

In the scintillator panel, since a range in which the plurality of columnar crystals are fused and adhered to each other is limited to at least a part on the bottom surfaces of the concave section, deterioration of the crystals is small.

In the scintillator panel according to the aspect, the scintillator panel may further include second scintillator unit formed on the bottom surfaces of the concave section of the substrate. In this case, upon manufacture thereof, for example, when the concave section is scanned with the laser beam to separate the first scintillator units from each other, since the second scintillator unit formed on the bottom surfaces of the concave section function as the protective film, damage to interconnections or the like installed on the substrate can be prevented.

In the scintillator panel according to the aspect, the convex sections may be arranged on the front surface of the substrate in a two-dimensional array, the concave section may be defined on the front surface of the substrate by the convex sections in a lattice shape, and a thickness of the second scintillator unit in a crossing region of the concave section may be larger than a thickness of the second scintillator unit at a position other than the crossing region. For this reason, as described above, upon manufacture thereof, for example, when the concave section is scanned with the laser beam to separate the first scintillator units from each other, as the second scintillator unit having a relatively larger thickness function as the protective film in the crossing region to which the laser beam is radiated twice, the substrate can be sufficiently protected.

In the scintillator panel according to the aspect, at least a part of the second scintillator unit may be solidified after being melted by radiation of the laser beam.

According to another aspect of the present invention, there is provided a radiation detector including the above-mentioned scintillator panel, in which the substrate is a sensor panel having a plurality of photoelectric conversion elements arranged to be optically coupled to the first scintillator unit. As described above, since the radiation detector includes the scintillator panel that can be increased in thickness while suppressing deterioration of the crystals, characteristics such as MTF or the like can be improved. In particular, since the substrate is the sensor panel including the photoelectric conversion elements, the convex sections can be directly formed on the photoelectric conversion elements, and the scintillator units can be formed on the convex sections. For this reason, there is no need to attach the scintillator panel and the sensor panel, which are separately prepared.

Advantageous Effects of Invention

According to an aspect of the present invention, it is possible to provide a method of manufacturing a scintillator panel, a scintillator panel, and a radiation detector that are capable of increasing a film thickness while suppressing deterioration of a crystal.

DESCRIPTION OF EMBODIMENTS

Figure 1:
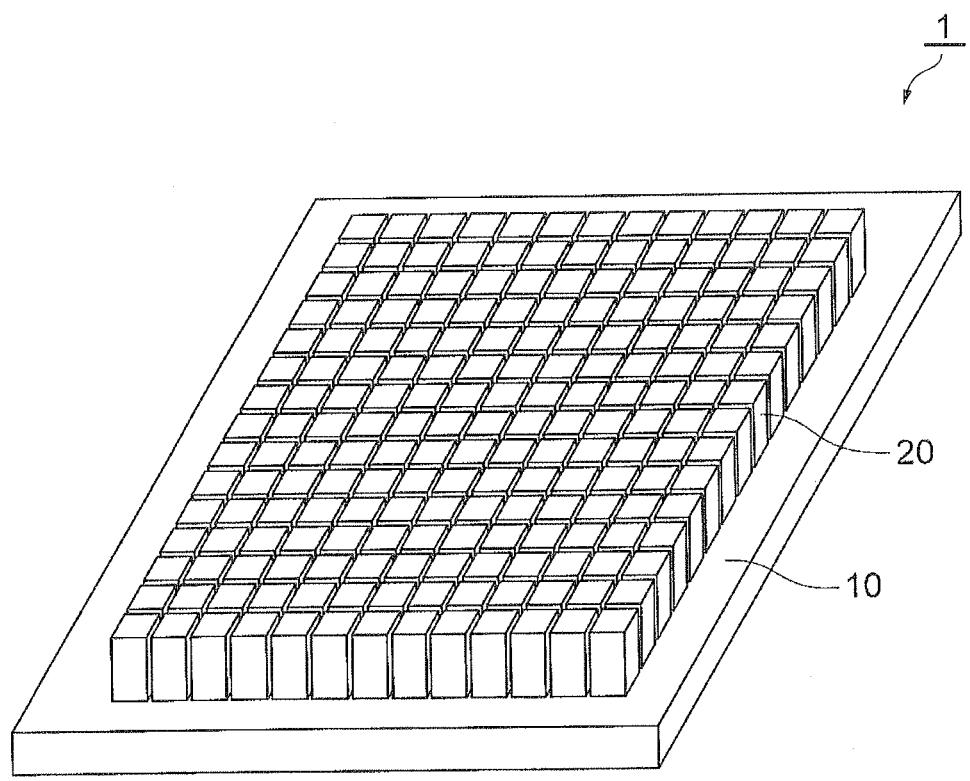
FIG. 1 is a perspective view of a scintillator panel according to an embodiment.

Hereinafter, a method of manufacturing a scintillator panel and a scintillator panel manufactured by the manufacturing method according to the embodiment will be described with reference to the accompanying drawings. Further, in the drawings, the same or corresponding portions are designated by the same reference numerals, and overlapping description thereof will be omitted. The scintillator panel of the embodiment to be described below is a panel configured to convert an entered radiation R such as an X-ray or the like into scintillation light such as visible light or the like, and for example, may be used as a device for radiation imaging in a mammography apparatus, a chest inspection apparatus, a CT apparatus, a dental photography apparatus, a radiation camera, and so on.

Figure 2:
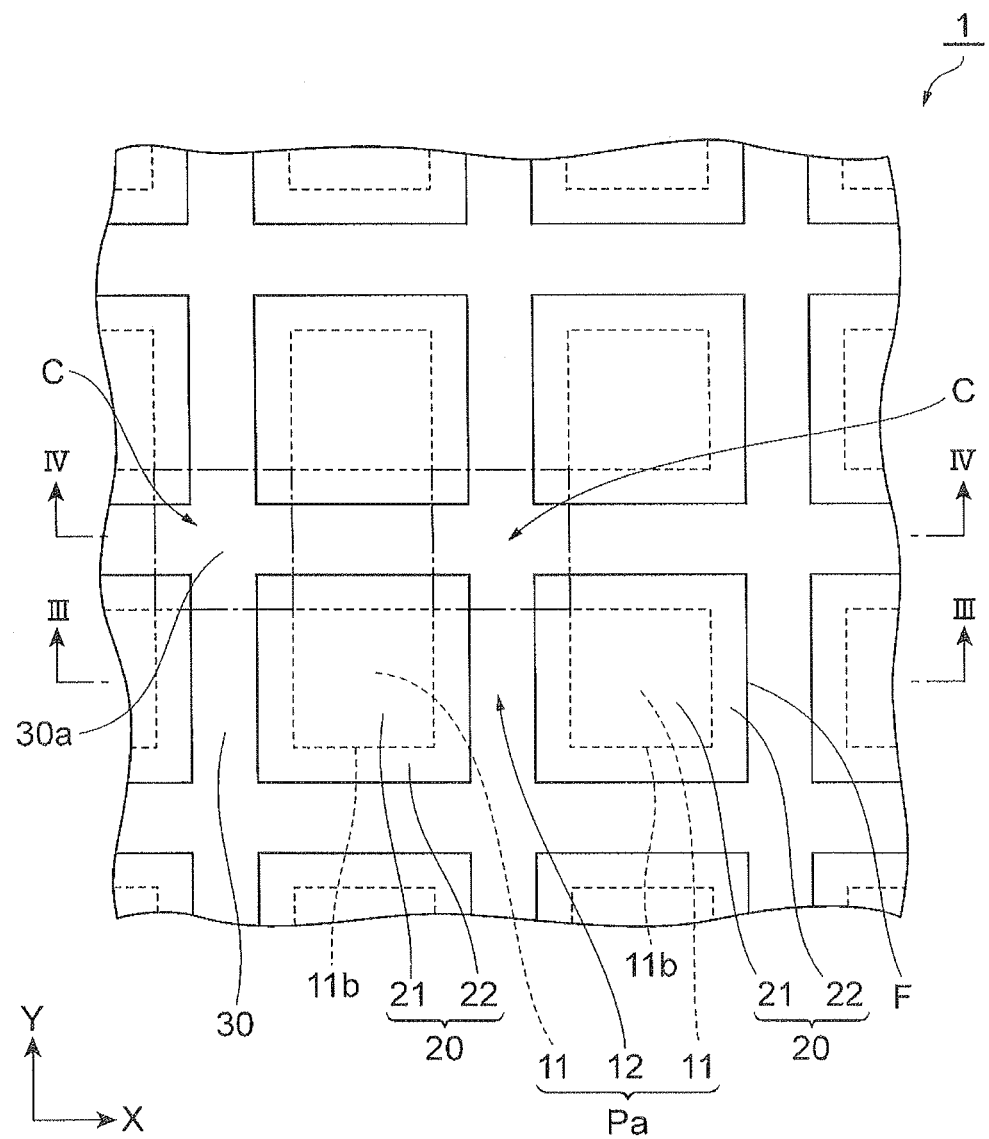
FIG. 2 is a partial plan view of the scintillator panel shown in FIG. 1.
Figure 3:
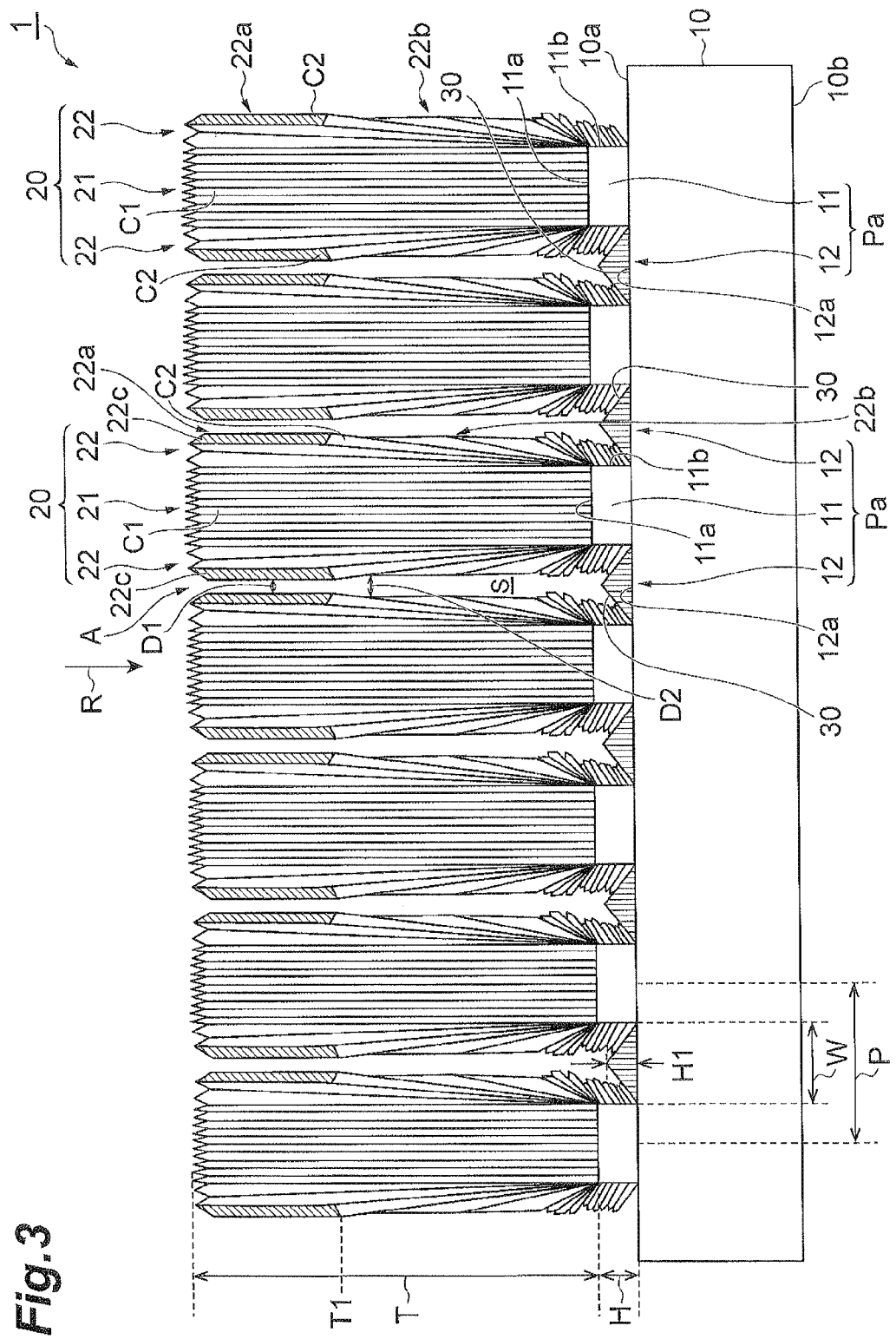
FIG. 3 is a cross-sectional view taken along line of FIG. 2.
Figure 4:
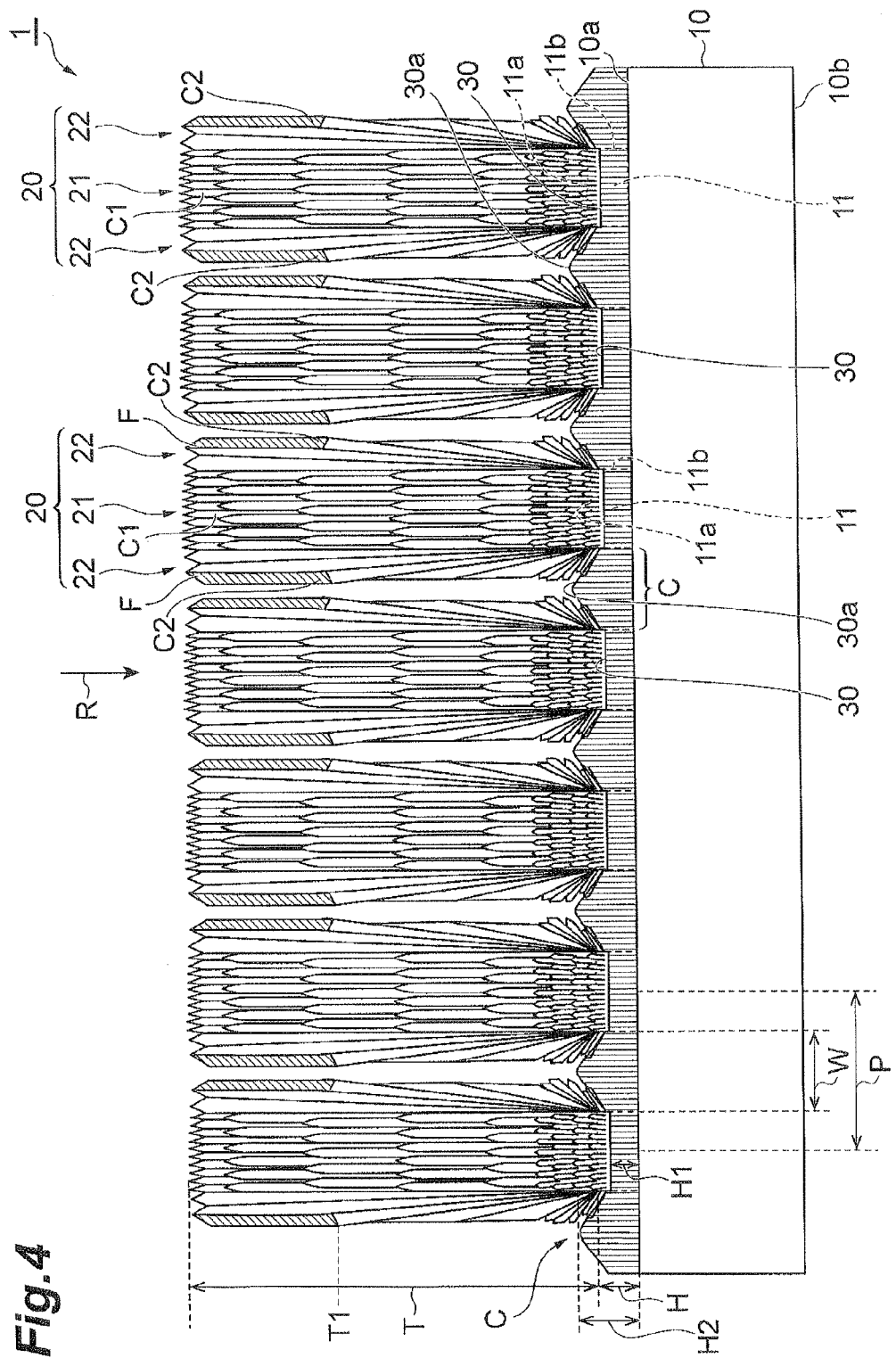
FIG. 4 is a cross-sectional view taken along line IV-IV of FIG. 2.

First, a scintillator panel according to the embodiment will be described. FIG. 1 is a perspective view of the scintillator panel according to the embodiment of the present invention. FIG. 2 is a partial plan view of the scintillator panel shown in FIG. 1. FIG. 3 is a cross-sectional view taken along line III-III of the scintillator panel shown in FIG. 2. FIG. 4 is a cross-sectional view taken along line IV-IV of the scintillator panel shown in FIG. 2. As shown in FIGS. 1 to 4, the scintillator panel 1 includes a rectangular substrate 10.

The substrate 10 has a front surface 10a and a rear surface 10b opposite to each other. The substrate 10 has a concavoconvex pattern Pa formed on the front surface 10a. As a material of the substrate 10, for example, a metal such as Al, SUS (stainless steel), or the like, a resin film such as a polyimide, polyethylene terephthalate, polyethylene naphthalate, or the like, a carbon-based material such as amorphous carbon, a carbon-fiber-reinforced plastic, or the like, and a fiber optic plate (FOP: an optical device obtained by binding a plurality of optical fibers having a diameter of several microns (for example, J5734 manufactured by Hamamatsu Photonics Company Limited)) or the like, may be used. As a material of the concavoconvex pattern Pa, for example, a high aspect resist, which is also referred to as an epoxy based resin (KMPR, SU-8 or the like manufactured by Nippon Kayaku Co., Ltd), silicon, glass, and so on may be used.

In particular, a material of a convex section constituting the concavoconvex pattern Pa may be a material having permeability with respect to scintillation light generated in a scintillator unit 20, and in this case, the scintillator panel 1 and the sensor panel having photoelectric conversion elements may be bonded at the rear surface 10b side of the substrate 10 to constitute a radiation detector. In addition, the concavoconvex pattern Pa may be constituted by the same scintillator material (for example, CsI (cesium iodide)) as the scintillator unit 20 (which will be described below).

The concavo-convex pattern Pa is formed of a plurality of convex sections 11 and concave section 12 defined by the convex sections 11. That is, the plurality of convex sections 11 and concave section 12 are formed at the front surface 10a of the substrate 10. The convex sections 11 protrude from the front surface 10a in a predetermined direction from the rear surface 10b toward the front surface 10a of the substrate 10 (here, an incidence direction of the radiation R, and a direction perpendicular to the front surface 10a or the rear surface 10b of the substrate 10). Each of the convex sections 11 is formed in a rectangular parallelepiped shape. The convex sections 11 are periodically arranged on the front surface 10a of the substrate 10 in a two-dimensional array along an X axis and a Y axis parallel to the substrate 10 and perpendicular to each other. Accordingly, the concave section 12 defined by the convex sections 11 is groove forming a rectangular lattice shape when seen in a plan view. Hereinafter, a region in which a region extending in the X-axis direction of the concave section 12 and a region extending in the Y-axis direction cross each other is referred to as a crossing region C.

In dimensions of the concavo-convex patterns Pa, for example, when a pitch P of the convex section 11 (a formation period of the convex section 11) is about 127 μm, a width (a groove width) W of the concave section 12 may be about 45 to 200 μm, and when the pitch P of the convex section 11 is about 200 μm, the width W of the concave section 12 may be about 50 μm to 70 μm. In addition, a height H of the convex section 11 may be about 2.5 μm to 50 μm. In particular, in the embodiment, the pitch P of the convex section 11 is about 200 μm, the width W of the concave section 12 is about 70 μm, and the height H of the convex section 11 is about 15 μm.

The scintillator panel 1 includes the plurality of scintillator units (first scintillator units) 20 formed on the convex sections 11, and scintillator units (second scintillator unit) 30 and 30a formed in the concave section 12. The scintillator units 20 are separated from each other (i.e., the scintillator panel 1 has a discrete type scintillator unit). The scintillator unit 20 may be formed by a scintillator material forming a columnar crystal, for example, referred to as CsI (cesium iodide). A height (a scintillator film thickness) T of the scintillator unit 20 may be, for example, about 100 μm to 600 μm.

The scintillator units 20 extend from the convex sections 11 in a predetermined direction, and are separated from each other. The scintillator unit 20 has a first portion 21 and a second portion 22. The first portion 21 forms a rectangular shape corresponding to a shape of the convex section 11 when seen in a plan view. The second portion 22 forms a rectangular ring shape to cover side sections of the first portion 21 when seen in a plan view. The first portion 21 extends from an upper surface 11a of the convex section 11 in an incidence direction of the radiation R (a direction substantially perpendicular to the substrate 10). More specifically, the first portion 21 is constituted by a plurality of columnar crystals C1 of a scintillator material formed through crystal growth from the upper surface 11a of the convex section 11 in the incidence direction of the radiation R.

The second portion 22 extends from a side surface 11b of the convex section 11 in the incidence direction of the radiation R to come in contact with the first portion 21. The second portion 22 is formed to overhang sideward from the side surface 11b of the convex section 11 and is disposed over a bottom surface of the concave section 12. The second portion 22 is integrally formed with the first portion 21 (adhered to the first portion 21). More specifically, the second portion 22 is constituted by a plurality of columnar crystals C2 of a scintillator material formed through crystal growth in a direction (a direction crossing a predetermined direction) crossing the incidence direction (a direction substantially perpendicular to the substrate 10) of the radiation R from the side surface 11b of the convex section 11, and extends in the incidence direction of the radiation R as a whole. The columnar crystal C2 is formed at the entire side surface 11b of the convex section 11.

The columnar crystal C1 constituting the first portion 21 forms a tapered shape having a diameter that increases away from the upper surface 11a of the convex section 11. That is, a columnar diameter of the columnar crystal C1 increases away from the upper surface 11a of the convex section 11 (i.e., from a base end section of the upper surface 11a side toward a front end section of an opposite side). The columnar crystal C2 constituting the second portion 22 forms a tapered shape having a diameter that increases away from the side surface 11b of the convex section 11. That is, the columnar diameter of the columnar crystal C2 increases away from the side surface 11b of the convex section 11 (i.e., from the base end section of the side surface 11b side toward the front end section of the opposite side).

In particular, a magnification rate of the columnar diameter of the columnar crystal C2 is larger than a magnification rate of a columnar diameter R1 of the columnar crystal C1. Accordingly, for example, in the front end sections, the columnar diameter of the columnar crystal C2 is relatively larger than the columnar diameter of the columnar crystal C1. Further, the height H of the above-mentioned convex section 11 is larger than at least the columnar diameter of the base end sections of the columnar crystal C1 constituting the first portion 21 and the columnar crystal C2 constituting the second portion 22. Accordingly, the plurality of columnar crystals C1 or columnar crystals C2 are formed on the upper surface 11a or the side surface 11b of the convex section 11.

The second portion 22 has an upper section 22a and a lower section 22b. The upper section 22a is a portion of the second portion 22 closer to a front end side than a height T1 serving as an intermediate position in the height direction of the scintillator unit 20. The lower section 22b is a portion of the second portion 22 closer to a base end side than the height T1. A part of the front end side of the upper section 22a becomes a fusion-bonding section 22c. The fusion-bonding section 22c is a region formed by a laser beam radiated to separate the plurality of scintillator units 20 from each other, and is formed at an outer side surface of the upper section 22a. In the adjacent the scintillator units 20, the fusion-bonding sections 22c are separated from each other. In addition, the lower sections 22b of the adjacent scintillator units 20 are separated from each other. In the fusion-bonding sections 22c, the plurality of columnar crystals C2 are fused and adhered to each other, and a columnar structure is collapsed. In addition, in the fusion-bonding sections 22c, the front end section of the columnar crystal C2 is destroyed by radiation of the laser beam.

In this way, the plurality of scintillator units 20 are separated from each other by radiation of the laser beam, and gaps S are formed between the adjacent scintillator units 20. The gaps S are formed by the adjacent scintillator units 20 and bottom surfaces of concave section 12. The gaps S have an interval D1 between the upper sections 22a opposite to each other via the gaps S, and have a larger interval D2 than the interval D1 between the lower sections 22b opposite to each other via the gaps S. However, the gaps S have a wedge shape and an interval is increased toward the front end section of the scintillator unit 20 at a laser beam incidence position A (a position between the front end sections of the scintillator units 20). That is, the gaps S have an hourglass shape constricted at an intermediate position in the height direction (a position between the upper sections 22a opposite to each other via the gaps S) as a whole.

The scintillator units 30 and 30a are formed in the concave section 12, in particular, on a bottom surface 12a of the concave section 12. The scintillator unit 30 is formed in a region different from the region corresponding to a lattice point of the lattice-shaped concave section 12 when seen in a plan view, i.e., in a region other than the crossing region C of the concave section 12. The scintillator unit 30a is formed in a region corresponding to the lattice point of the lattice-shaped concave section 12 when seen in a plan view, i.e., in the crossing region C of the concave section 12. The scintillator units 30 and 30a are integrally formed with the entire concave section 12. The height H1 of the scintillator unit 30 is configured to be smaller than the height H of the convex section 11. In addition, the height H2 of the scintillator unit 30a is configured to be larger than the height H of the convex section 11. That is, the thickness of the scintillator unit 30a is configured to be larger than the thickness of the scintillator unit 30. The scintillator units 30 and 30a function as a protective film configured to protect the substrate 10 from radiation of the laser beam (to be described below).

The scintillator units 30 and 30a are constituted by a plurality of columnar crystals of a scintillator material referred to as CsI, like the first portion 21 and the second portion 22 of the scintillator unit 20. The columnar crystals constituting the scintillator units 30 and 30a are formed through crystal growth from the bottom surface 12a of the concave section 12 in the incidence direction of the radiation R. The scintillator unit 30 forms a convex shape (a substantially triangular cross-section) having a thickness that increases from corners of the concave section 12 (connecting portions between the side surfaces 11b of the convex section 11 and the bottom surface 12a of the concave section 12) toward a center in the width direction of the concave section 12. The scintillator unit 30a forms a convex shape (a substantially conical shape), a thickness of which is largest at the center point of the crossing region C of the concave section 12 and reduces away from the center point. Further, the scintillator units 30 and 30a may come in contact with the second portion 22 to support the columnar crystal C2 of the second portion 22 extending from the side surface 11b of the convex section 11 from the bottom surface 12a side of the concave section 12. In connection with this, the columnar diameter of the columnar crystal of the portion of the second portion 22 in contact with the scintillator unit 30 is smaller than the columnar diameter R1 of the columnar crystal C1 of the first portion 21. The scintillator units 30 and 30a may be partially or entirely solidified after being melted by radiation of the laser beam.

Figure 5:
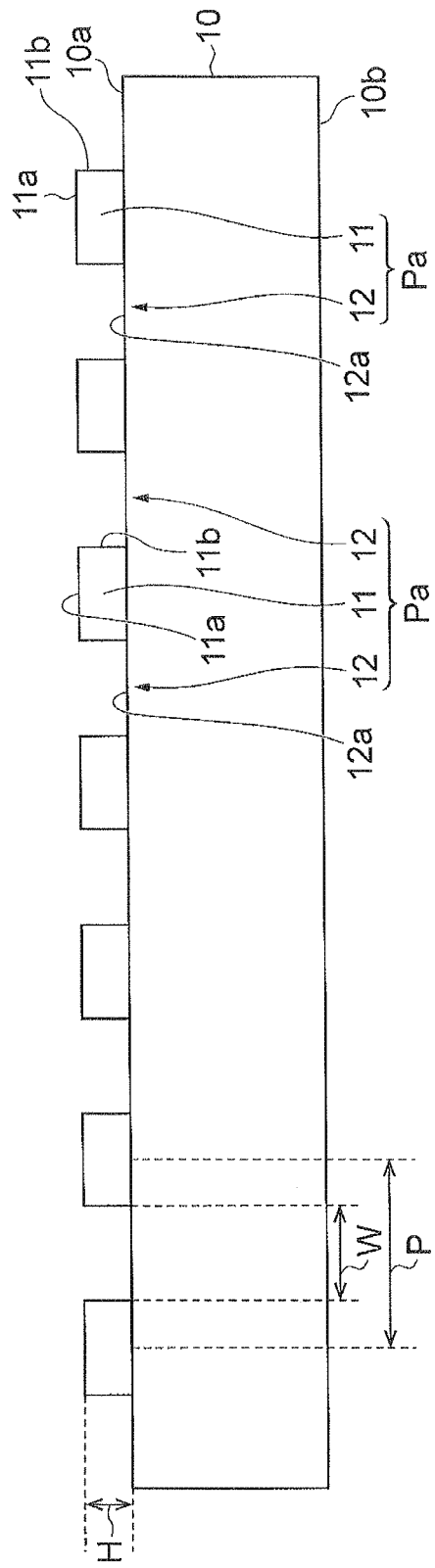
FIG. 5 is a cross-sectional view showing a scintillator panel manufacturing procedure according to the embodiment.
Figure 6:
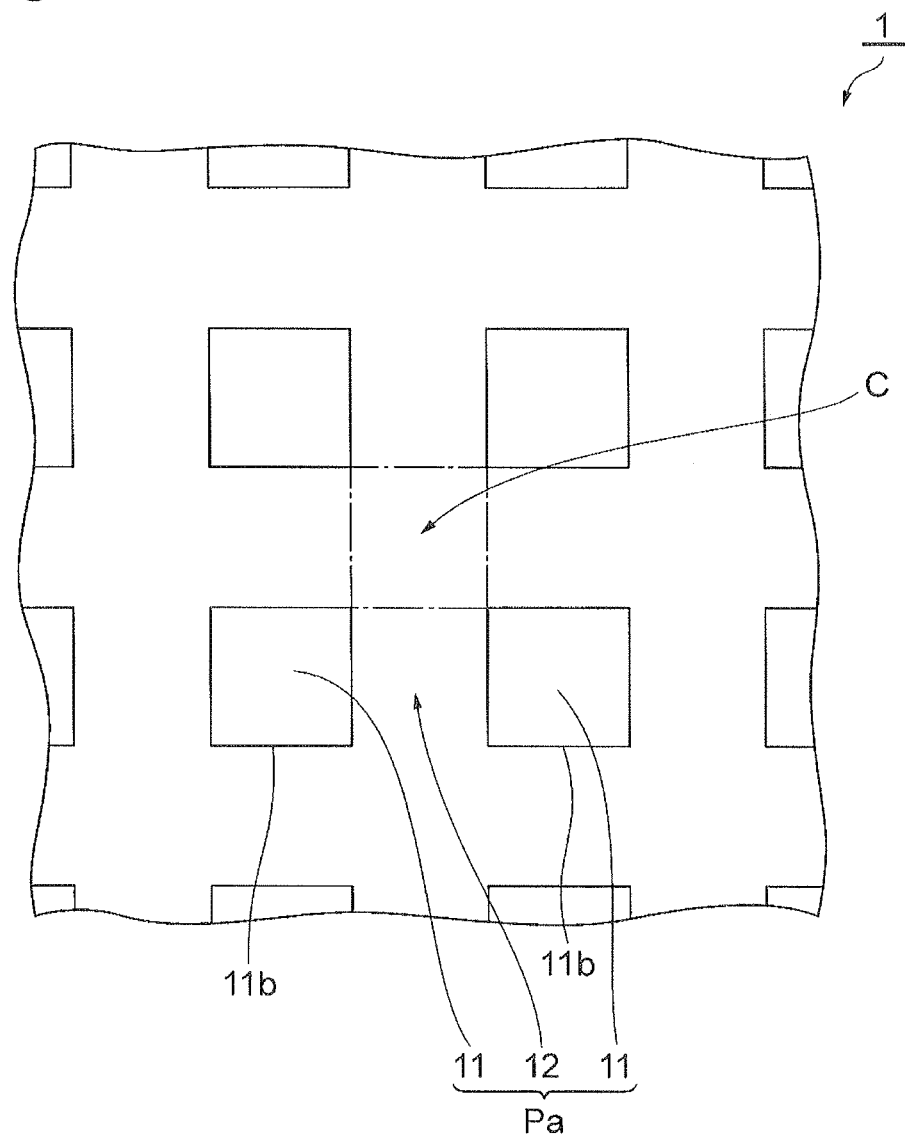
FIG. 6 is a partial plan view showing the scintillator panel manufacturing procedure according to the embodiment.

Next, a method of manufacturing the scintillator panel 1 will be described with reference to FIGS. 5 to 8. First, the plurality of convex sections 11 and the concave section 12 defined by the convex sections 11 are formed on the front surface 10a of the substrate 10 (a first process). When the concavo-convex pattern Pa is formed, a base material serving as the substrate 10 is prepared, and as shown in FIG. 5, a material of the concavo-convex pattern Pa is applied and dried on the base material. Next, the concavo-convex pattern Pa is formed on the base material through photolithography to manufacture the substrate 10 having the concavoconvex pattern Pa of a predetermined dimension (the first process). Here, the concavo-convex pattern Pa is formed in which the convex section 11 protrudes in a predetermined direction from the rear surface 10b of the substrate 10 toward the front surface 10a (here, an incidence direction of the radiation R and a direction perpendicular to the front surface 10a or the rear surface 10b of the substrate 10). In addition, as the convex sections 11 are arranged in a two-dimensional array in the X-axis direction and the Y-axis direction, as shown in FIG. 6, the concave section showing a rectangular lattice shape when seen in a plan view are formed. Further, the concavo-convex pattern Pa may be formed on the base material through screen printing.

Figure 7:
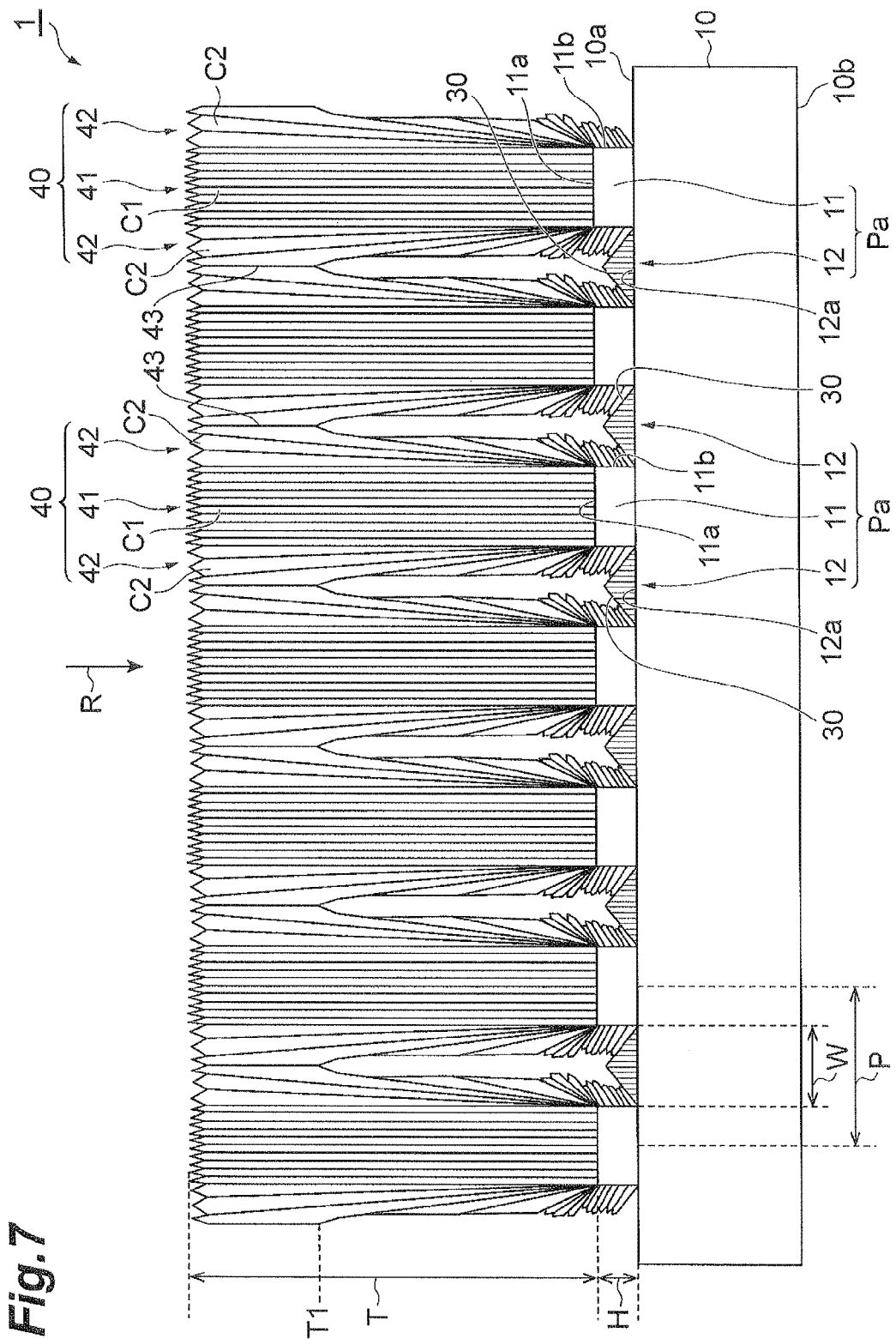
FIG. 7 is a cross-sectional view showing the scintillator panel manufacturing procedure according to the embodiment.

Next, as shown in FIG. 7, as the columnar crystals C1 and C2 of the scintillator material referred to as CsI are grown, scintillator units 40 extending in a predetermined direction from the convex sections 11 of the substrate 10 (here, in the incidence direction of the radiation R and the direction perpendicular to the front surface 10a or the rear surface 10b of the substrate 10) are formed (a second process). Here, the scintillator units 30 and 30a are formed on the bottom surface 12a of the concave section 12 of the substrate 10 through crystal growth (a fourth process). The scintillator unit 40 is formed to include a first portion 41 having a rectangular shape to correspond to a shape of the convex section 11 when seen in a plan view, and a second portion 42 having a rectangular ring shape to cover side sections of the first portion 21 when seen in a plan view. The scintillator unit 40 is a portion that becomes the scintillator unit 20 (to be described below).

Here, the crystal of the scintillator material is grown until the scintillator unit on the upper surface 11a of the convex section 11 arrives at a predetermined height (for example, 100 μm to 600 μm). Accordingly, as shown in FIG. 7, the plurality of scintillator units 40 separated from each other at a portion closer to the base end side than the height T1 (a portion that will become the above-mentioned lower section 22b) and in contact with each other at a portion closer to the front end side than the height T1 (a portion that will become the above-mentioned upper section 22a) are formed. As a result, the plurality of scintillator units 40 having boundary surfaces serving as contact portions 43 are formed. The scintillator unit 30 is formed in the concave section 12 except for the crossing region C. The scintillator unit 30a is formed in the concave section 12 in the crossing region C. The scintillator unit 30a is formed to have a larger thickness than the scintillator unit 30.

The scintillator units 30, 30a and 40 are formed on the substrate 10 by depositing the scintillator material referred to as CsI through, for example, vacuum deposition. As various deposition conditions (a vacuum level, a deposition rate, a substrate heating temperature, an angle of a vapor flow, and so on) are controlled, the above-mentioned scintillator units 30, 30a and 40 are formed on the concavo-convex pattern Pa. The scintillator units 20, 30, 30a and 40 can also be formed using a vapor phase deposition method, in addition to the vacuum deposition.

Figure 8:
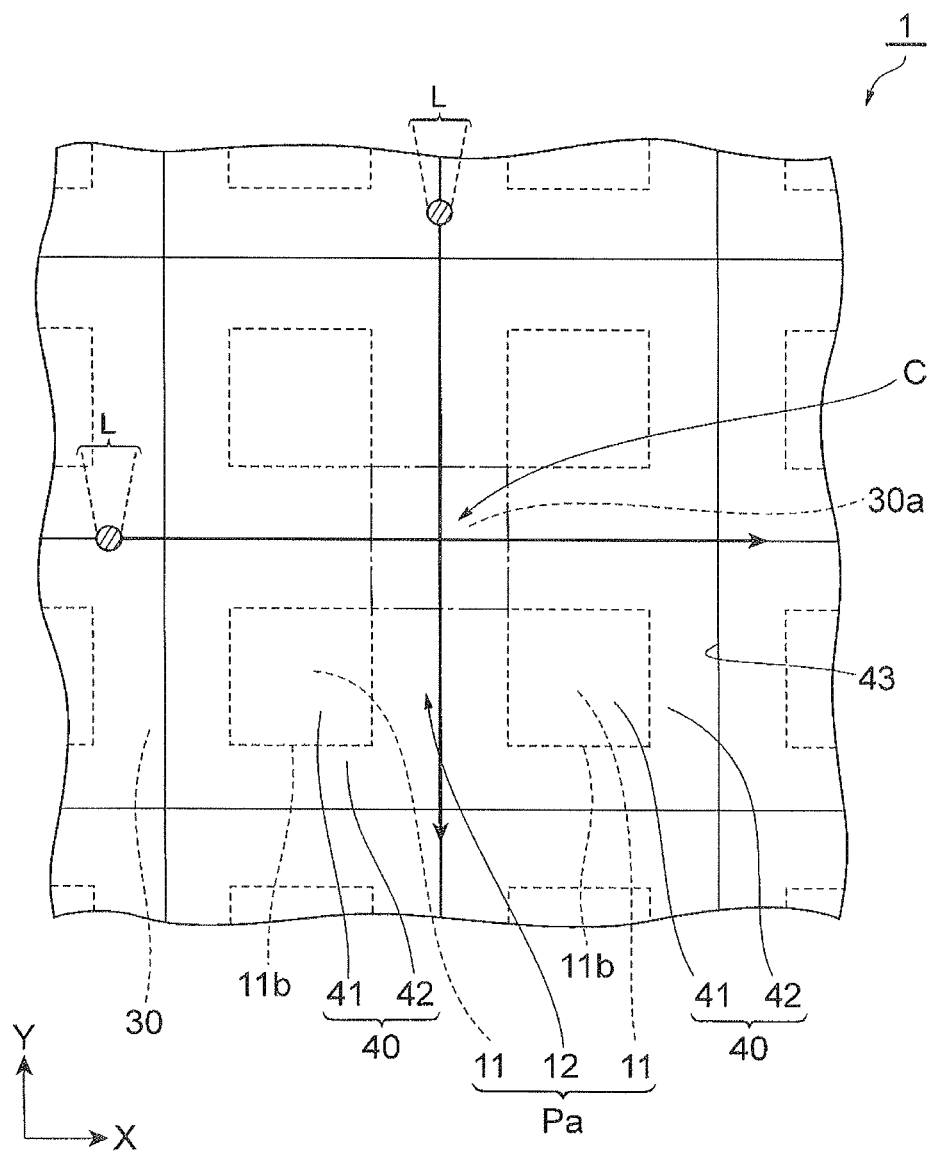
FIG. 8 is a partial plan view showing the scintillator panel manufacturing procedure according to the embodiment.

Next, the laser beam L is radiated to the contact portions 43 of the scintillator units 40 extending from the adjacent convex sections 11, and the scintillator units 40 are separated from each other by scanning the concave section 12 with a laser beam L (a third process). FIG. 8 is a view showing a process of separating the scintillator units 40 using the laser beam L. As shown in FIG. 8, as the contact portions 43 of the scintillator units 40 are scanned with the laser beam L in the X-axis direction and the Y-axis direction, the laser beam L is radiated to the contact portions 43 of the scintillator units 40 extending from the adjacent convex sections 11. A part of the second portion 42 of the scintillator unit 40 is cut and removed by radiation of the laser beam L to separate the scintillator units 40 from each other. According to the scanning with the laser beam L, in the crossing region C of the concave section 12, as scanning with the laser beam L is performed in the X-axis direction and the Y-axis direction, the laser beam L is radiated two times. In the contact portions 43 of the scintillator units 40, as the laser beam L is radiated, the plurality of columnar crystals C2 are fused and adhered to each other. Accordingly, the fusion-bonding section 22c is formed at a part of the second portion 42 of the scintillator unit 40. In this way, as the laser beam L is radiated to separate the plurality of scintillator units 40 from each other, the scintillator units 20 are formed and the scintillator panel 1 is manufactured.

As the laser beam used herein, for example, a laser beam having a wavelength of 515 nm, a pulse having a width of 1 ps and a cyclic frequency of 20 kHz and obtained through second harmonic generation (SHG), or a laser beam having a wavelength of 258 nm, a pulse having a width of 1 ps and a cyclic frequency of 20 kHz and obtained through fourth harmonic generation (SHG) may be used.

In this way, as the contact portions of the adjacent scintillator units 20 are scanned with the laser beam, the scintillator units 20 formed through crystal growth can be spaced apart from each other (i.e., pixelation of the scintillator units can be realized). Since the crystal growth is performed in a state in which the lower sections 22b of the scintillator units 20 are spaced apart from each other, when scanning with the laser beam is performed, the laser beam is radiated to only a part of the upper sections 22a of the adjacent scintillator units 20.

As described above, in the method of manufacturing the scintillator panel 1 according to the embodiment, as the crystal growth of the columnar crystal of the scintillator material is performed, the scintillator units 40 extending from the convex sections 11 of the substrate 10 in the predetermined direction are formed. For this reason, the scintillator units 40 are formed to be separated from each other by the predetermined height with the upper surface 11a of the convex section 11 as the origin, and in contact with each other from the predetermined height to over the concave section 12. Accordingly, as the concave section 12 is scanned with the laser beam L, when the laser beam L is radiated to the contact portions 43 of the scintillator units 40 to separate the scintillator units 40 from each other, the scintillator units 20 having an increased thickness are obtained. In addition, according to separation of the scintillator units 40, since the laser beam may be preferably radiated to only the contact portion 43, deterioration of the crystal can be suppressed.

In addition, in the method of manufacturing the scintillator panel 1 of the embodiment, since the scintillator unit 30 formed on the bottom surface 12a of the concave section 12 functions as a protective film, for example, when the substrate 10 is the sensor panel, damage to interconnections or the like installed on the sensor panel when the laser beam L is radiated can be prevented. In particular, in the method of manufacturing the scintillator panel 1 according to the embodiment, when the lattice-shaped concave section 12 is scanned with the laser beam L, since the scintillator unit 30a having a relatively large thickness functions as the protective film in the crossing region C of the concave section 12 to which the laser beam L is radiated twice, damage to the interconnections or the like installed on the substrate (the sensor panel) 10 can be more securely prevented.

The above-mentioned embodiment has been described as an embodiment of the scintillator panel according to an aspect of the present invention. Accordingly, aspects of the present invention are not limited to the above-mentioned scintillator panels 1 to 1C, Aspects of the present invention may include arbitrary modifications of the above-mentioned scintillator panel 1 or applications to other scintillator panels without departing from the spirit of the present invention.

For example, in the above-mentioned embodiment, while the case in which the aspect of the present invention is applied to the scintillator panel has been described, the aspect of the present invention may be applied to the radiation detector including the above-mentioned scintillator panel or the like. In this case, the radiation detector may include the above-mentioned scintillator panel 1, and the substrate 10 may be the sensor panel (the TFT panel or the CMOS image sensor panel) including the plurality of photoelectric conversion elements arranged to optically couple to the scintillator unit 20.

In this case, for example, the convex sections 11 corresponding to the pixels of the TFT panel or the CMOS image sensor serving as the substrate 10 are formed, and the scintillator units 20 and 30 are formed thereon. The material of the convex section 11 and the method of forming the same are as described above. Here, the convex sections 11 may be constituted by the material having permeability with respect to the scintillation light generated in the scintillator unit 20.

According to the above-mentioned radiation detector, since the above-mentioned scintillator panel 1 is provided, characteristics can be improved. In addition, since the substrate 10 is the sensor panel including the photoelectric conversion elements, when the convex section 11 is directly formed on the photoelectric conversion elements to form the scintillator unit 20, there is no need to stick the scintillator panel and the sensor panel, which are separately prepared, together.

REFERENCE SIGNS LIST

1 . . . scintillator panel, 10 . . . substrate (sensor panel), 11 . . . convex section, 11a . . . upper surface, 11b . . . side surface, 12 . . . concave section, 12a . . . bottom surface, 20, 40 . . . scintillator unit (first scintillator unit), 22c . . . fusion-bonding section, 30 . . . scintillator unit (second scintillator unit), 30a . . . scintillator unit, 43 . . . contact portion, C . . . crossing region, C1, C2 . . . columnar crystal, R . . . radiation.

The invention claimed is:

1. A method of manufacturing a scintillator panel configured to convert radiation into scintillation light, the method comprising:

a first process of forming a plurality of convex sections that protrude in a predetermined direction from a rear surface toward a front surface and concave section defined by the convex sections, on the front surface of the substrate having the front surface and the rear surface;

a second process of forming first scintillator units respectively extending from the convex sections of the substrate in the predetermined direction through crystal growth of a columnar crystal of a scintillator material; and a third process of radiating a laser beam to contact portions of the first scintillator units extending from the adjacent convex sections and separating the first scintillator units extending from the adjacent convex sections by scanning the concave section with the laser beam.

2. The method of manufacturing the scintillator panel according to claim 1, further comprising, before the third process, a fourth process of forming second scintillator unit on bottom surfaces of the concave section of the substrate.

3. The method of manufacturing the scintillator panel according to claim 2, wherein,
in the first process, the concave section defined in a lattice shape are formed on the front surface of the substrate by forming the convex sections to be arranged on the front surface of the substrate in a two-dimensional array, and
in the fourth process, a thickness of the second scintillator unit in a crossing region of the concave section is larger than a thickness of the second scintillator unit at a position other than the crossing region.

4. A scintillator panel configured to convert radiation into scintillation light, the scintillator panel comprising:
a substrate having a front surface and rear surface, the substrate is formed with a plurality of convex sections protruding from the front surface in a predetermined direction from the rear surface toward the front surface, and concave section defined by the convex sections; and
a plurality of first scintillator units respectively extending from the convex sections in the predetermined direction and separated from each other,
wherein the first scintillator units are respectively formed through crystal growth of a plurality of columnar crystals on the convex sections, and
at least a part of the columnar crystals constituting the first scintillator unit over bottom surface of the concave section are fused and adhered to each other through radiation of a laser beam.

5. The scintillator panel according to claim 4, further comprising second scintillator unit formed on the bottom surfaces of the concave section of the substrate.

6. The scintillator panel according to claim 5, wherein the convex sections are arranged on the front surface of the substrate in a two-dimensional array,
the concave section is defined on the front surface of the substrate by the convex sections in a lattice shape, and
a thickness of the second scintillator unit in a crossing region of the concave section is larger than a thickness of the second scintillator unit at a position other than the crossing region.

7. The scintillator panel according to claim 5, wherein at least a part of the second scintillator unit is solidified after being melted by radiation of the laser beam.

8. A radiation detector configured to detect radiation, the radiation detector comprising:
a substrate comprising a plurality of photoelectric conversion elements and having a front surface and rear surface, the substrate is formed with a plurality of convex sections protruding from the front surface in a predetermined direction from the rear surface toward the front surface, and concave section defined by the convex sections, the plurality of convex sections being formed so that the plurality of convex sections respectively correspond to the plurality of photoelectric conversion elements; and
a plurality of first scintillator units respectively extending from the convex sections in the predetermined direction and separated from each other,
wherein the first scintillator units are respectively formed through crystal growth of a plurality of columnar crystals on the convex sections, and
at least a part of the columnar crystals constituting the first scintillator unit over bottom surface of the concave section are fused and adhered to each other through radiation of a laser beam.

9. The scintillator panel according to claim 6, wherein at least a part of the second scintillator unit is solidified after being melted by radiation of the laser beam.

10. The radiation detector according to claim 8, further comprising second scintillator unit formed on the bottom surfaces of the concave section of the substrate.

11. The radiation detector according to claim 10, wherein the convex sections are arranged on the front surface of the substrate in a two-dimensional array,
the concave section is defined on the front surface of the substrate by the convex sections in a lattice shape, and
a thickness of the second scintillator unit in a crossing region of the concave section is larger than a thickness of the second scintillator unit at a position other than the crossing region.

12. The radiation detector according to claim 10, wherein at least a part of the second scintillator unit is solidified after being melted by radiation of the laser beam.

13. The radiation detector according to claim 11, wherein at least a part of the second scintillator unit is solidified after being melted by radiation of the laser beam.

14. A method of manufacturing a radiation detector configured to detect radiation, the method comprising:
a first process of forming a plurality of convex sections that protrude in a predetermined direction from a rear surface toward a front surface and concave section defined by the convex sections, on the front surface of the substrate comprising a plurality of photoelectric conversion elements and having the front surface and the rear surface, the plurality of convex sections being formed so that the plurality of convex sections respectively correspond to the plurality of photoelectric conversion elements;
a second process of forming first scintillator units respectively extending from the convex sections of the substrate in the predetermined direction through crystal growth of a columnar crystal of a scintillator material; and
a third process of radiating a laser beam to contact portions of the first scintillator units extending from the adjacent convex sections and separating the first scintillator units extending from the adjacent convex sections by scanning the concave section with the laser beam.

15. The method of manufacturing the radiation detector according to claim 14, further comprising, before the third process, a fourth process of forming second scintillator unit on bottom surfaces of the concave section of the substrate.

16. The method of manufacturing the radiation detector according to claim 15, wherein,
in the first process, the concave section defined in a lattice shape are formed on the front surface of the substrate by forming the convex sections to be arranged on the front surface of the substrate in a two-dimensional array, and in the fourth process, a thickness of the second scintillator unit in a crossing region of the concave section is larger than a thickness of the second scintillator unit at a position other than the crossing region.

\* \* \* \* \*